United States Patent
Sun et al.

(10) Patent No.: US 8,889,523 B2
(45) Date of Patent: Nov. 18, 2014

(54) SEMICONDUCTOR PROCESS

(75) Inventors: Te-Lin Sun, Kaohsiung (TW);
Chien-Liang Lin, Taoyuan County (TW); Yu-Ren Wang, Tainan (TW); Ying-Wei Yen, Miaoli County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 396 days.

(21) Appl. No.: 13/342,191

(22) Filed: Jan. 2, 2012

(65) Prior Publication Data

US 2013/0171837 A1 Jul. 4, 2013

(51) Int. Cl.
*H01L 21/76* (2006.01)
*H01L 21/02* (2006.01)
*H01L 21/318* (2006.01)
*H01L 21/762* (2006.01)

(52) U.S. Cl.
CPC ...... *H01L 21/02247* (2013.01); *H01L 21/3185* (2013.01); *H01L 21/76224* (2013.01); *H01L 21/02329* (2013.01)
USPC ..... 438/424; 438/435; 438/775; 257/E21.293

(58) Field of Classification Search
CPC ............. H01L 21/76224; H01L 21/76229; H01L 21/28208; H01L 21/02329; H01L 21/3124; H01L 29/518; H01L 21/02247; H01L 21/3185
USPC ................. 438/435, 437, 424, 775, 776, 791; 257/E21.293
See application file for complete search history.

(56) References Cited

U.S. PATENT DOCUMENTS

| | | |
|---|---|---|
| 6,498,383 B2 | 12/2002 | Beyer |
| 7,045,436 B2 | 5/2006 | Chatterjee |
| 7,229,896 B2 | 6/2007 | Chen |
| 7,361,572 B2 | 4/2008 | Chen |
| 7,510,925 B2 * | 3/2009 | Miyanami ............... 438/197 |
| 7,569,502 B2 | 8/2009 | Olsen |
| 2009/0020845 A1 * | 1/2009 | Shin et al. .............. 257/506 |
| 2009/0267176 A1 * | 10/2009 | Yang et al. .............. 257/506 |
| 2011/0256708 A1 * | 10/2011 | Choi et al. .............. 438/593 |
| 2013/0105861 A1 * | 5/2013 | Liao et al. .............. 257/192 |

* cited by examiner

*Primary Examiner* — Michael Trinh
(74) *Attorney, Agent, or Firm* — Winston Hsu; Scott Margo (57) ABSTRACT

A semiconductor process includes the following steps. A substrate having a recess is provided. A decoupled plasma nitridation process is performed to nitride the surface of the recess for forming a nitrogen containing liner on the surface of the recess. A nitrogen containing annealing process is then performed on the nitrogen containing liner.

19 Claims, 6 Drawing Sheets

SEMICONDUCTOR PROCESS

BACKGROUND OF THE INVENTION

1. Field of the Invention

The present invention relates generally to a semiconductor process, and more specifically, to a semiconductor process, which forms a nitrogen containing liner by performing a decoupled plasma nitridation process and a nitrogen containing annealing process.

2. Description of the Prior Art

In semiconductor processes, in order to provide good electrical isolation and to prevent short-circuits between electric devices on a wafer, a localized oxidation isolation (LOCOS) process, or a shallow trench isolation (STI) process is used to insulate and protect devices. Since the field oxide layer of the LOCOS process consumes a large area on the wafer, and since bird's beaks can occur when growing the field oxide, an STI process is typically used in the semiconductor processes when the line width is below 0.25 µm.

An STI process involves first forming a shallow trench between each device, and then filling the trench with an insulating material to obtain an electrical isolation effect between each device. In modern processes, an oxide will be formed on the side of the trench before the isolating material is filled into the trench, in order to further insulate the isolating material from the surface of the recess. However, as size scales down, the inverse narrow width effect (INWE) becomes more important, leading performances of the semiconductor components to degrade seriously, wherein the inverse narrow width effect (INWE) is the effect of the threshold voltage of a transistor reducing as the channel width of the transistor reduces.

Therefore, a method, which can solve said negative effect is extremely needed to overcome the problems caused by the downscaling of the devices size.

SUMMARY OF THE INVENTION

The present invention provides a semiconductor process, which forms a nitrogen containing liner by performing a decoupled plasma nitridation process and a nitrogen containing annealing process, in order to overcome abovementioned problems.

The present invention provides a semiconductor process including the following steps. A substrate having a recess is provided. A decoupled plasma nitridation process is performed to nitride the surface of the recess, in order to form a nitrogen containing liner on the surface of the recess. A nitrogen containing annealing process is then performed on the nitrogen containing liner.

According to the above description, the present invention provides a semiconductor process, which forms a nitrogen containing liner by performing a decoupled plasma nitridation process, and then performs a nitrogen containing annealing process on the nitrogen containing liner. By doing this, the nitrogen containing liner can reduce the inverse narrow width effect (INWE) and therefore improve the device performances. Due to the nitrogen containing annealing process being performed on the nitrogen containing liner after the decoupled plasma nitridation process is performed, the nitrogen concentration in the nitrogen containing liner increases and the reduction of the nitrogen concentration decay upon time decreases.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
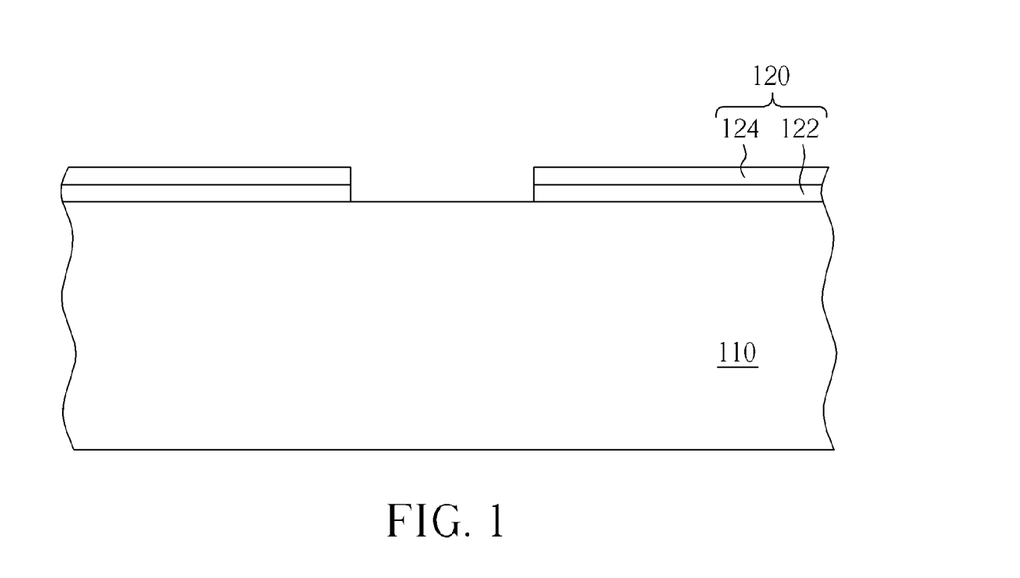
FIGS. 1-7 schematically depict a cross-sectional view of a semiconductor process according to the first embodiment of the present invention.
Figure 2:
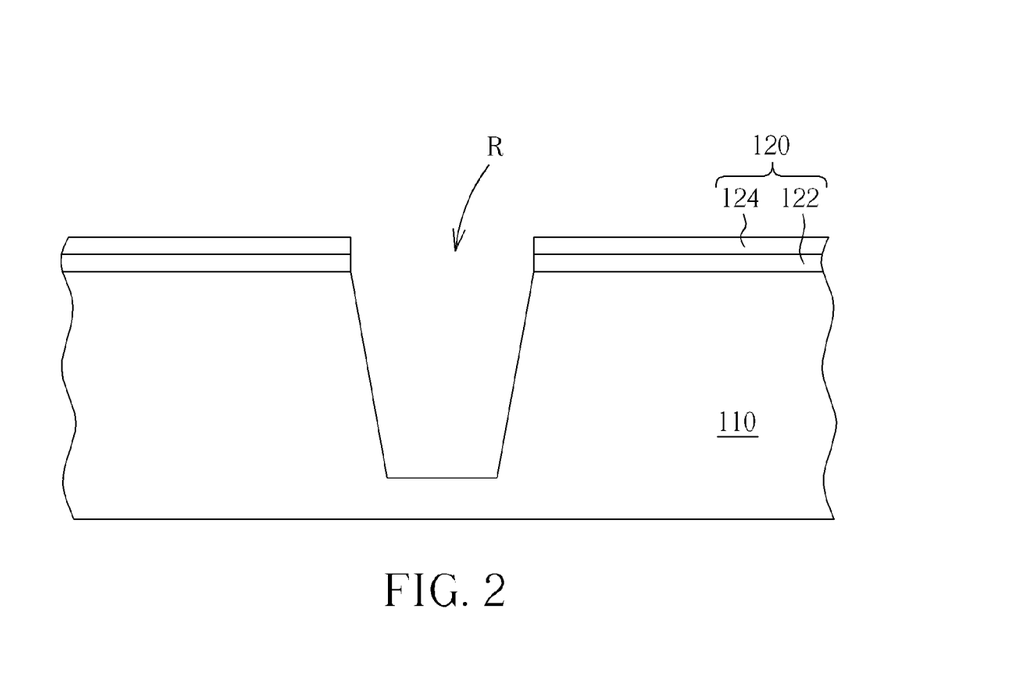

FIGS. 1-7 schematically depict a cross-sectional view of a semiconductor process according to the first embodiment of the present invention. As shown in FIGS. 1-2, a substrate 110 having a recess R is provided. As shown in FIG. 1, the substrate 110 is provided, wherein the substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. A hard mask layer (not shown) is formed on the substrate 110 and is patterned to form a patterned hard mask layer 120. The steps of forming the patterned hard mask layer 120 may include: forming a patterned photoresist (not shown) on the hard mask layer (not shown) by performing a photolithography process, wherein the pattern of the photoresist (not shown) defines the location of the recess R to form below. The hard mask layer (not shown) is patterned by the pattern of the photoresist (not shown). In this embodiment, the patterned hard mask layer 120 may include a pad oxide layer 122 on the substrate 110 and a pad nitride layer 124 on the pad oxide layer 122. As shown in FIG. 2, the pattern of the hard mask layer 120 is transferred onto the substrate 110 by methods such as etching, to form the recess R in the substrate 110.

Figure 3:
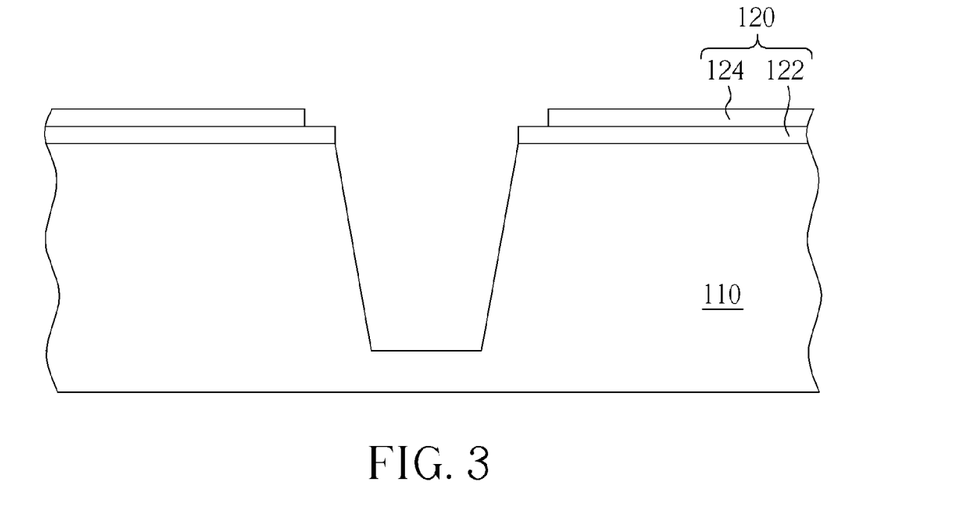

As shown in FIG. 3, after the recess R is formed, the pad nitride layer 124 is back etched. In this embodiment, the method used for back etching the pad nitride layer 124 may be a pull back process, which is performed by exposing the top corners of the recess R to ensure that the top corners get nitrided during the following steps, and broadening the opening of the recess R defined by the patterned hard mask layer 120, so as to make it beneficial for the sequential trench-filling process performed, but not limited thereto. When forming a shallow trench isolation, the filling material top angle in the recess R induces a local stress concentration that will tend to get eroded while the following etching or cleaning processes are carried out, and divot structures may be formed at the same time. In a narrow wordline process, parasitic capacitances are formed in these divot structures, which affect the performances of the components. The pull back process can prevent this from happening.

Figure 4:
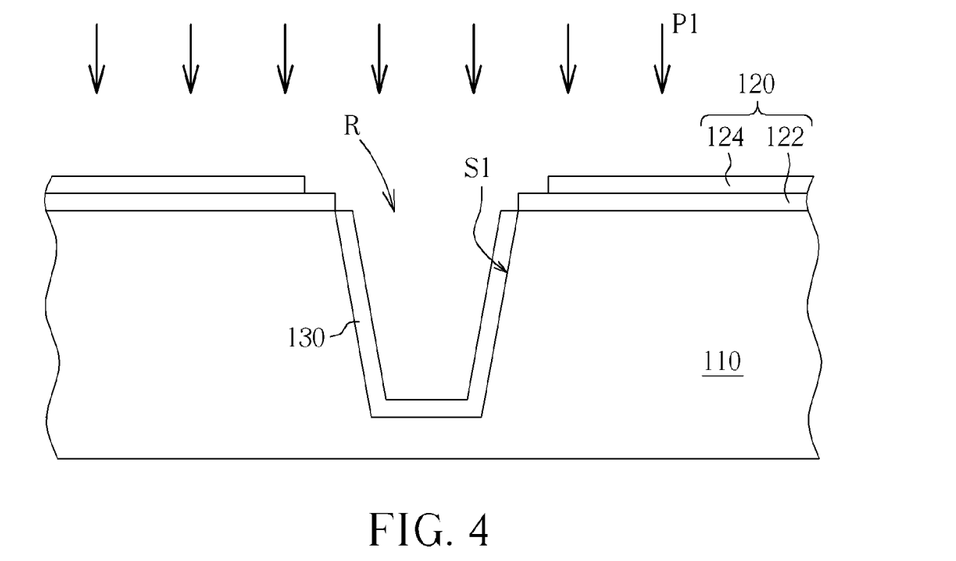

As shown in FIG. 4, a decoupled plasma nitridation process P1 is performed to nitride the surface S1 of the recess R, and a nitrogen containing liner 130 can be formed on the surface S1 of the recess R. The nitrogen containing liner 130 can reduce the inverse narrow width effect (INWE) of the prior art and therefore improve performances of forming devices, such as MOS transistors. In this embodiment, the decoupled plasma nitridation process P1 is preferred to be performed at room temperature, but is not limited thereto. In a preferred embodiment, the processing time of the decoupled plasma nitridation process is about 1 second to 10 minutes, the processing temperature is about 20° C.~600° C., the plasma power is about 1000~2000 Watts and the pressure is about 5~200 mtorrs. In one case, as the substrate 110 includes a silicon substrate, the nitrogen containing liner 130 should therefore include a silicon nitride layer because the nitrogen containing liner 130 is nitrided from the surface S1 of the silicon substrate by the decoupled plasma nitridation process P1. Moreover, a pre-cleaning process (not shown) may be selectively performed to remove impurities, such as native oxide layer, or residues, etc . . . , before the decoupled plasma nitridation process P1 is performed. By doing this, the structure of the nitrogen containing liner 130 can be smoother and more uniform. In one case, the pre-cleaning process (not shown) may include a diluted hydrofluoric acid (DHF) containing pre-cleaning process or a standard cleaning 1 (SC1) solution containing pre-cleaning process, which is good for achieving the purpose of removing impurities, such as native oxide layer.

Figure 5:
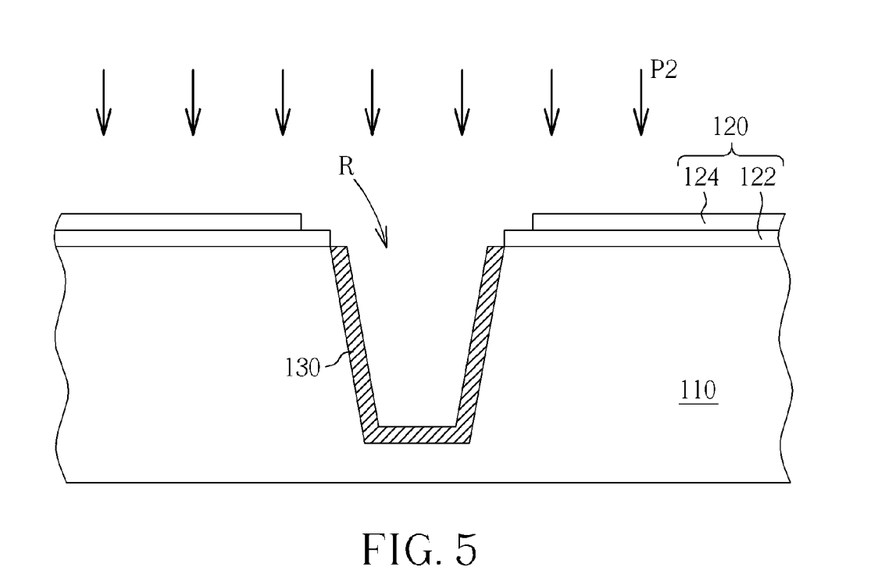

As shown in FIG. 5, a nitrogen containing annealing process P2 is performed on the nitrogen containing liner 130. The nitrogen concentration of the nitrogen containing liner 130 formed merely by the decoupled plasma nitridation process P1 would decay rapidly and the variations in the sequential semiconductor process would increase, leading the quality of the formed semiconductor components to be hard to control. Besides, the capacity of reducing the inverse narrow width effect (INWE) of the nitrogen containing liner 130 of the present invention will also be degraded as the nitrogen concentration of the nitrogen containing liner 130 decays depending upon time. Thus, a nitrogen containing annealing process P2 is carried out after the decoupled plasma nitridation process P1 is performed in the present invention. It can not only retard the decay of the nitrogen concentration of the nitrogen containing liner 130 upon time, but also increase the nitrogen concentration of the nitrogen containing liner 130. As a result, the efficiency of the nitrogen containing liner 130 is improved.

Figure 10:
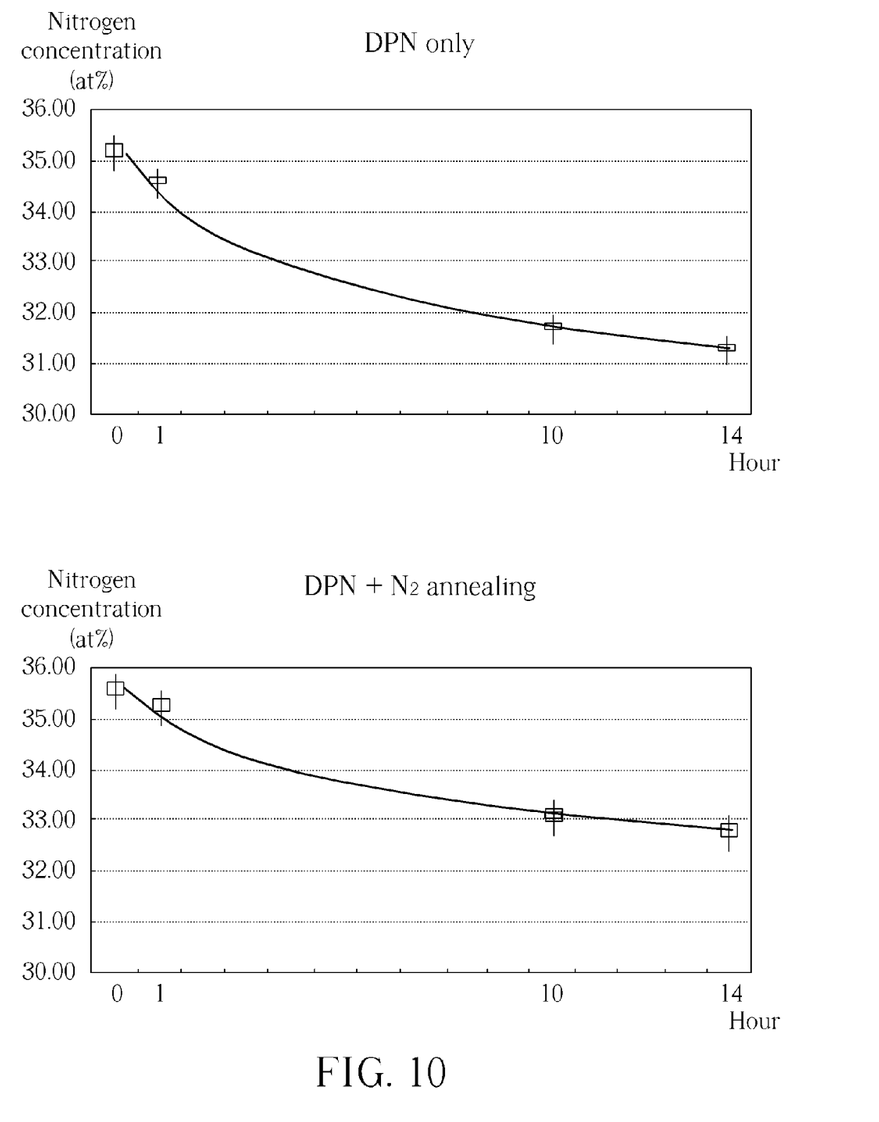
FIG. 10 schematically depicts a diagram of the nitrogen concentration of a liner versus time of the first embodiment of the present invention and of a liner without performing a nitrogen containing annealing process.

FIG. 10 schematically depicts a diagram of the nitrogen concentration of a liner versus time of the first embodiment of the present invention, and of a liner without performing a nitrogen containing annealing process. The top part of FIG. 10 depicts a diagram of the nitrogen concentration of a liner versus time without performing a nitrogen containing annealing process, wherein the liner has only undergone the decoupled plasma nitridation process P1. The bottom part of FIG. 10 depicts a diagram of the nitrogen concentration of a liner versus time of the first embodiment of the present invention, wherein the nitrogen containing annealing process P2 is performed after the liner is formed by decoupled plasma nitridation process P1. As shown in the top part of FIG. 10, the nitrogen concentration shows a 0.61% decay one hour after the nitrogen containing liner is formed. As shown in the bottom part of FIG. 10, the nitrogen concentration only decays of 0.3% one hour after the nitrogen containing liner 130 is formed. Furthermore, as shown in the top part of FIG. 10, the nitrogen concentration shows a decay of 3.51% ten hours after the nitrogen containing liner is formed. As shown in the bottom part of FIG. 10, the nitrogen concentration has only decayed of 2.51% ten hours after the nitrogen containing liner 130 is formed. The curve of the nitrogen concentration versus time of the bottom part of FIG. 10 is higher than the one of the nitrogen concentration versus time of the top part of FIG. 10, meaning that the nitrogen concentration of the nitrogen containing liner 130 (having undergone the nitrogen containing annealing process P2) is higher than the nitrogen concentration of the nitrogen containing liner with no nitrogen containing annealing process P2 performed onto. To sum up, this process can increase the nitrogen concentration of the nitrogen containing liner and retard the decay of the nitrogen concentration of the nitrogen containing liner upon time, only by performing the nitrogen containing annealing process P2 after the decoupled plasma nitridation process P1 is performed.

In one embodiment of the present invention, the nitrogen containing annealing process P2 may be an imported nitrogen gas annealing process, or an imported ammonia gas annealing process, but it is not limited thereto, depending upon the needs and the surrounding processes. The annealing temperature of the nitrogen containing annealing process P2 is preferred to be higher than 800° C. and the processing time of the nitrogen containing annealing process P2 is preferred to be in a range of 10~60 seconds, so that the purpose of the process of the present invention can be achieved with a high enough temperature and a long enough processing time. In the present invention, the nitrogen containing annealing process P2 may include a rapid thermal processing (RTP) process, but it is not limited thereto.

Figure 6:
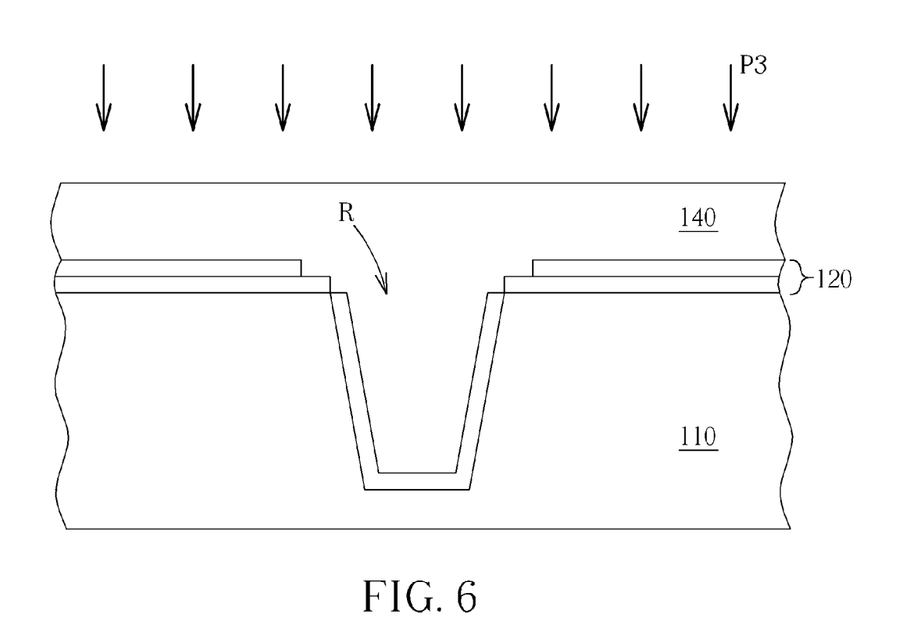

As shown in FIG. 6, a dielectric material 140 is filled into the recess R after the nitrogen containing annealing process P2 is performed. The material of the dielectric material 140 may include oxide, but is not limited thereto. A high temperature process P3 is performed to densify the dielectric material 140. In a preferred embodiment, the processing temperature of the high temperature process P3 is higher than 1000° C. In this embodiment, the processing temperature of the high temperature process P3 is 1050° C. This way, the structure of the dielectric material 140 can be denser so as to improve the isolation capacity, and the electrical performance of formed semiconductor components are improved as well.

Figure 7:
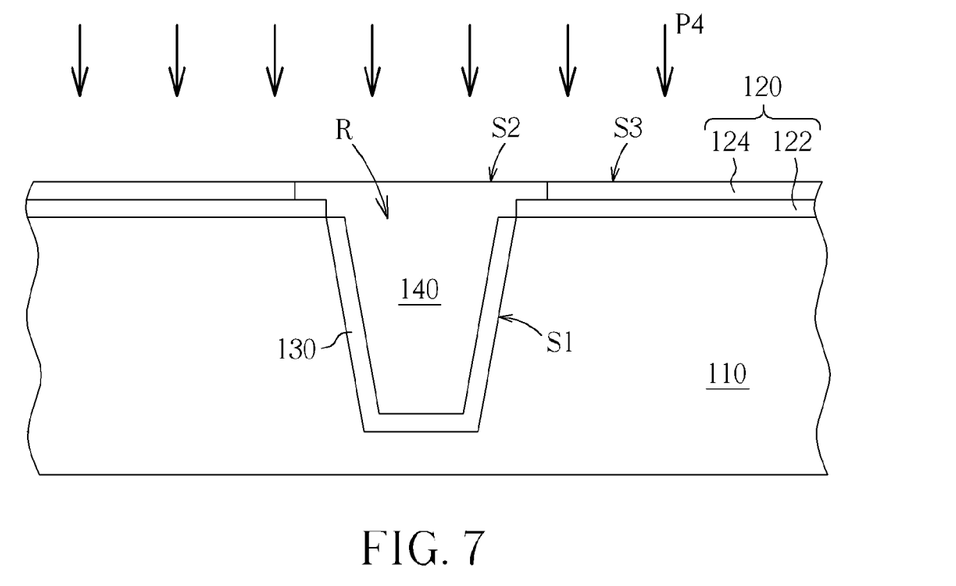

As shown in FIG. 7, a polishing process P4 is performed to planarize the dielectric material 140: the top surface S2 of the dielectric material 140 is leveled with the top surface S3 of the pad nitride layer 124. The polishing process P4 may be a chemical mechanical polishing (CMP) process, but it is not limited thereto. The pad nitride layer 124 and the pad oxide layer 122 are sequentially removed.

In the first embodiment, the nitrogen containing liner 130 is just a single layer. A second embodiment will be described below, where another liner, or other liners, is formed after the formation of the nitrogen containing liner 130.

Figure 8:
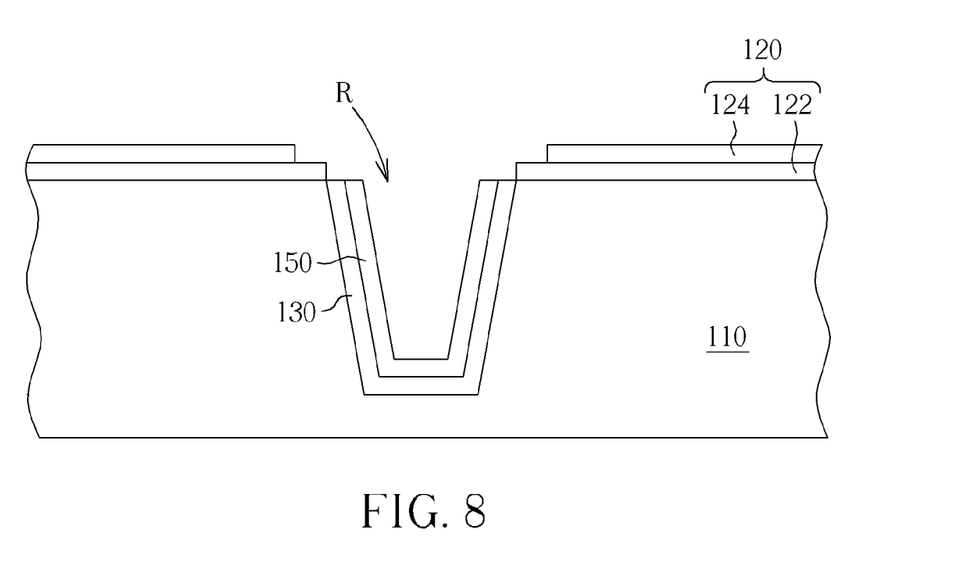
FIGS. 8-9 schematically depict a cross-sectional view of a semiconductor process according to the second embodiment of the present invention.
Figure 9:
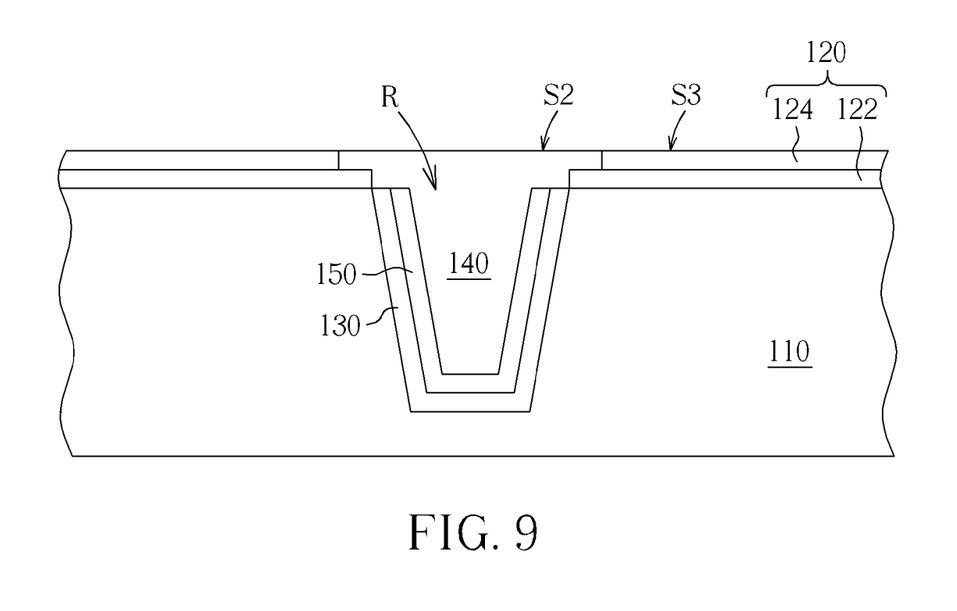

FIGS. 8-9 schematically depict a cross-sectional view of a semiconductor process according to the second embodiment of the present invention. The previous steps of the second embodiment are similar to those of the previous steps of the first embodiment (as shown in FIGS. 1-5). The steps include: a substrate 110 is provided; a patterned hard mask layer 120 is formed on the substrate 110, wherein the hard mask layer 120 may include a pad oxide layer 122 formed on the substrate 110 and a pad nitride layer 124 formed on the pad oxide layer 122; a recess R is formed in the substrate 110; a decoupled plasma nitridation process P1 is performed to nitride the surface S1 of the recess R, thereby a nitrogen containing liner 130 is formed on the surface S1 of the recess R; and a nitrogen containing annealing process P3 is performed on the nitrogen containing liner 130.

Likewise, the nitrogen containing liner 130 can reduce the inverse narrow width effect (INWE) of the prior art, therefore improving performances of formed devices, such as MOS transistors or etc. In a preferred embodiment, the decoupled plasma nitridation process P1 is performed at room temperature. The processing time of the decoupled plasma nitridation process p1 is preferred to be about 1 second to 10 minutes, the processing temperature is about 20° C.~600° C., the plasma power is about 1000~2000 Watts and the pressure is about 5~200 mtorrs. The nitrogen concentration of the nitrogen containing liner 130 formed only by the decoupled plasma nitridation process P1 would decay rapidly. That would increase variations in the sequential semiconductor process, leading the quality of formed semiconductor components to be hard to control. Besides, the capacity of reducing the inverse narrow width effect (INWE) of the nitrogen containing liner 130 of the present invention will also be degraded as the nitrogen concentration decays depending upon time. Thus, the nitrogen containing annealing process P2 is to be performed after the decoupled plasma nitridation process P1 is carried out in the present invention. It can not only retard the decay of the nitrogen concentration of the nitrogen containing liner 130 upon time, but also increase the nitrogen concentration of the nitrogen containing liner 130. As a result, the efficiency of the nitrogen containing liner 130 is improved.

As shown in FIG. 8, a second liner 150 is formed on the nitrogen containing liner 130 after the nitrogen containing annealing process P3 is performed. The second liner 150 may include an oxide layer, an oxynitride layer, a combination of both or etc. By doing this, the dielectric material 140 and the substrate 110 in the second embodiment can be better isolated than in the first embodiment.

As shown in FIG. 9, the dielectric material 140 is filled into the recess R and then polished to have the top surface S2 of the dielectric material 140 as the same level as the top surface S3 of the pad nitride layer 124. More precisely, a dielectric material (not shown) is filled into the recess R, wherein the material of the dielectric material may be an oxide, but not limited thereto. A high temperature process is performed to densify the dielectric material (not shown). In a preferred embodiment, the processing temperature of the high temperature process P3 is higher than 1000° C. In this embodiment, the processing temperature of the high temperature process P3 is 1050° C. This way, the structure of the dielectric material (not shown) can be denser. A polishing process is carried out to form a planarized dielectric material 140, wherein the top surface S2 of the dielectric material 140 is leveled with the top surface S3 of the pad nitride layer 124. The polishing process P4 may be a chemical mechanical polishing (CMP) process, but it is not limited thereto. Finally, the pad nitride layer 124 and the pad oxide layer 122 are sequentially removed.

To sum up, the present invention provides a semiconductor process, which forms a nitrogen containing liner by performing a decoupled plasma nitridation process and then performing a nitrogen containing annealing process on the nitrogen containing liner. This way, the nitrogen containing liner can reduce the inverse narrow width effect (INWE) of the prior art and therefore improving performances of formed devices, such as MOS transistors or etc. Furthermore, a nitrogen containing annealing process is performed on the nitrogen containing liner after the decoupled plasma nitridation process is performed; therefore the nitrogen concentration of the nitrogen containing liner increases and the nitrogen concentration decay upon time is retarded. In a preferred embodiment, the decoupled plasma nitridation process is performed at room temperature. The nitrogen containing annealing process is preferred to include an imported nitrogen gas annealing process or an imported ammonia gas annealing process. The annealing temperature of the nitrogen containing annealing process is preferred to be higher than 800° C. Thus, the purpose of the process in the present invention can be achieved fully by providing an appropriate temperature.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor process, comprising:
   providing a substrate having a silicon recess;
   performing a decoupled plasma nitridation process to nitride the surface of the silicon recess for forming a nitrogen containing liner contacting the surface of the silicon recess; and
   performing a nitrogen containing annealing process on the nitrogen containing liner.

2. The semiconductor process according to claim 1, wherein the decoupled plasma nitridation process is performed at room temperature.

3. The semiconductor process according to claim 1, wherein the processing time of the decoupled plasma nitridation process is one second to ten minutes long.

4. The semiconductor process according to claim 1, wherein the nitrogen containing annealing process comprises an imported nitrogen gas annealing process.

5. The semiconductor process according to claim 1, wherein the nitrogen containing annealing process comprises an imported ammonia gas annealing process.

6. The semiconductor process according to claim 1, wherein the annealing temperature of the nitrogen containing annealing process is higher than 800° C.

7. The semiconductor process according to claim 1, wherein the processing time of the nitrogen containing annealing process is between 10~60 seconds.

8. The semiconductor process according to claim 1, wherein the nitrogen containing annealing process comprises a rapid thermal processing process.

9. The semiconductor process according to claim 1, further comprising:
   forming an oxide layer on the nitrogen containing liner after performing the nitrogen containing annealing process on the nitrogen containing liner.

10. The semiconductor process according to claim 1, further comprising:
    forming an oxynitride layer on the nitrogen containing liner after performing the nitrogen containing annealing process on the nitrogen containing liner.

11. The semiconductor process according to claim 1, wherein the steps of providing the substrate having the silicon recess comprise:
    providing the substrate; and
    forming the silicon recess in the substrate.

12. The semiconductor process according to claim 11, wherein the steps of providing the substrate having the silicon recess comprise:
    forming a hard mask layer on the substrate;
    patterning the hard mask layer; and
    transferring the pattern of the hard mask layer onto the substrate to form the silicon recess in the substrate.

13. The semiconductor process according to claim 12, wherein the hard mask layer comprises a pad oxide layer on the substrate and a pad nitride layer on the pad oxide layer.

14. The semiconductor process according to claim 13, further comprising:
    back etching the pad nitride layer after forming the silicon recess.

15. The semiconductor process according to claim 1, further comprising:

filling a dielectric material in the silicon recess after performing the nitrogen containing annealing process on the nitrogen containing liner;

performing a high temperature process to densify the dielectric material; and performing a polishing process to planarize the dielectric material.

16. The semiconductor process according to claim 1, wherein the substrate comprises a silicon substrate and the nitrogen containing liner comprises a silicon nitride layer.

17. The semiconductor process according to claim 1, further comprising:

performing a pre-cleaning process to remove the native oxide layer and impurities on the surface of the silicon recess before the decoupled plasma nitridation process is performed.

18. The semiconductor process according to claim 17, wherein the pre-cleaning process comprises a diluted hydrofluoric acid (DHF) containing pre-cleaning process.

19. The semiconductor process according to claim1, wherein the nitrogen containing liner is formed only in the silicon recess.

\* \* \* \* \*